US006969224B2

(12) United States Patent
Miyachi et al.

(10) Patent No.: US 6,969,224 B2
(45) Date of Patent: Nov. 29, 2005

(54) WORKPIECE LEVITATING DEVICE

(75) Inventors: Hiroshi Miyachi, Arakawa-ku (JP); Yoshiteru Ueno, Yokohama (JP); Takeshi Nishikawa, Abiko (JP); Satoshi Suzuki, Moriya (JP)

(73) Assignee: SMC Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/998,661

(22) Filed: Nov. 30, 2004

(65) Prior Publication Data

US 2005/0117980 A1 Jun. 2, 2005

(30) Foreign Application Priority Data

Dec. 1, 2003 (JP) ............................. 2003-401990

(51) Int. Cl.[7] ............................................ B65G 35/00
(52) U.S. Cl. ..................................... 414/676; 73/570.5
(58) Field of Search ............................... 414/676, 403; 406/88, 89; 73/570.5; 219/648

(56) References Cited

U.S. PATENT DOCUMENTS

| 4,081,201 A | | 3/1978 | Hassan et al. | |
| 4,865,491 A | * | 9/1989 | Sakurai | ..................... 406/87 |
| 4,874,273 A | * | 10/1989 | Tokisue et al. | ............... 406/88 |
| 5,107,981 A | | 4/1992 | Markus | |
| 5,155,651 A | * | 10/1992 | Yoda et al. | .................. 361/144 |
| 5,634,636 A | * | 6/1997 | Jackson et al. | ............. 271/225 |
| 6,336,775 B1 | * | 1/2002 | Morita et al. | ................. 406/88 |
| 6,467,350 B1 | * | 10/2002 | Kaduchak et al. | ......... 73/570.5 |
| 6,781,684 B1 | * | 8/2004 | Ekhoff | ..................... 356/237.1 |

FOREIGN PATENT DOCUMENTS

| DE | 27 54 228 | 7/1978 |
| DE | 196 20 234 | 11/1997 |
| JP | 2000-062950 | 2/2000 |
| JP | 2000-136024 | 5/2000 |
| JP | 2002-289670 | 10/2002 |
| WO | WO 89/12014 | 12/1989 |
| WO | WO 97/44816 | 11/1997 |

* cited by examiner

Primary Examiner—Joe Dillon, Jr.
(74) Attorney, Agent, or Firm—Paul A. Guss

(57) ABSTRACT

A communication chamber defined in a body is supplied with a fluid under pressure through a pipe connected to a supply port defined in the body. The fluid under pressure is ejected from the communication chamber through fluid ejection members, which are made of a porous material and mounted on an end face of the body by a plate, toward a workpiece. The workpiece is levitated upwardly and held airborne by the fluid under pressure that is ejected toward the workpiece and the fluid under pressure that flows between the workpiece and the plate.

10 Claims, 13 Drawing Sheets

WORKPIECE LEVITATING DEVICE

BACKGROUND OF THE INVENTION

1. Field of the Invention

The present invention relates to a workpiece levitating device for holding and conveying a workpiece in the form of a thin plate while keeping the workpiece airborne.

2. Description of the Related Art

For conveying a workpiece in the form of a thin plate such as a liquid crystal glass substrate for use in liquid crystal display units, a semiconductor wafer, or the like, there has been used a levitating device in the art for levitating and holding the workpiece with a fluid. After the workpiece has been levitated by the levitating device, the workpiece is moved while being kept out of contact with other objects.

One levitating device employs a porous body having a plurality of pores for levitating a workpiece in the form of a thin plate such as a liquid crystal glass substrate, a semiconductor wafer, or the like while the workpiece is being conveyed. Specifically, air is ejected from the pores in the porous body toward the workpiece to levitate the workpiece a certain distance in the air under the force of the ejected air. The workpiece which is levitated by the levitating device is conveyed to a desired position while being kept out of contact with other objects and also kept free of dust. For details, see Japanese Laid-Open Patent Publication No. 2000-62950, for example.

Such workpieces are conveyed in a clean room in order to prevent dust particles from being attached to the surface of the workpieces. In the clean room, a downward flow of air is produced from above workers working on the workpieces to prevent dust particles produced by the workers from being applied to the workpieces, which are typically glass substrates, semiconductor wafers, or the like.

With the levitating device disclosed in Japanese Laid-Open Patent Publication No. 2000-62950, depending on the shape and weight of workpieces to be levitated and held in the air, it is necessary to employ an increased number of porous bodies for ejecting air toward workpieces at an increased rate. As a result, the amount of consumed air that is ejected to levitate workpieces with the levitating device is increased, resulting in an increased running cost.

The increased amount of air ejected from the porous body toward the workpieces tends to disturb the downward air flow which is produced in the clean room. As a consequence, dust particles from the workers may possibly be applied to the workpieces.

Since the workpieces are generally in the form of thin plates, the levitating device is required not to strain or flex the workpieces when they are upwardly levitated and held in the air. The forces of the ejected air are applied to a workpiece only at regions above the respective porous bodies and nearby regions. Therefore, if the surface area of the workpiece levitated by the ejected air streams is large, then the porous bodies are spaced from each other by large distances, and the workpiece has a large area between the porous bodies to which the forces of the ejected air are not applied. As a result, those regions of the workpiece to which the forces of the ejected air are not applied tend to be strained or flexed due to gravity.

SUMMARY OF THE INVENTION

It is a general object of the present invention to provide a workpiece levitating device which is capable of levitating and holding a workpiece in a stable state while controlling or reducing an amount of consumed air ejected to levitate the workpiece.

The above and other objects, features, and advantages of the present invention will become more apparent from the following description when taken in conjunction with the accompanying drawings in which preferred embodiments of the present invention are shown by way of illustrative example.

DESCRIPTION OF THE PREFERRED EMBODIMENTS

Figure 1:
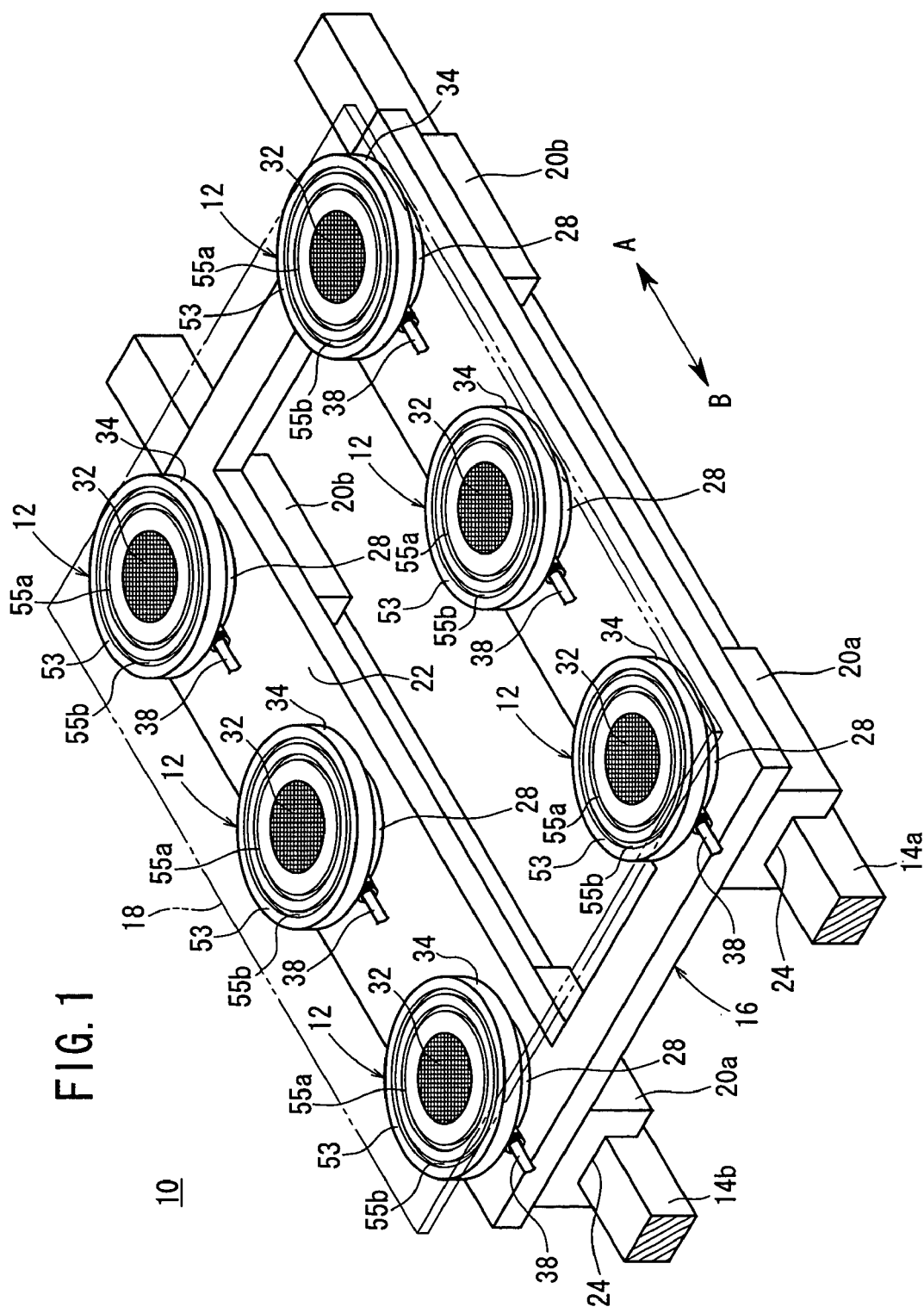
FIG. 1 is a perspective view of a workpiece conveying system incorporating a workpiece levitating device according to an embodiment of the present invention.

In FIG. 1, the reference numeral 10 represents a workpiece conveying system incorporating a workpiece levitating device 12 (hereinafter referred to as "levitating device 12") according to an embodiment of the present invention.

The workpiece conveying system 10 has a pair of straight guide rails 14a, 14b extending substantially parallel to each other, a slide mechanism 16 slidably displaceable along the guide rails 14a, 14b in the axial direction thereof, and a plurality of levitating devices 12 for levitating and holding a workpiece 18 in the form of a thin plate, e.g., a liquid crystal glass substrate.

The guide rails 14a, 14b are spaced from each other by a predetermined distance, and the slide mechanism 16 slidably engages upper portions of the guide rails 14a, 14b. The slide mechanism 16 comprises two pairs of guide blocks 20a, 20b slidably engaging the guide rails 14a, 14b respectively, and a substantially horizontal plate-like table 22 interconnecting the guide blocks 20a, 20b.

The guide blocks 20a, 20b are of a substantially U-shaped cross section and have respective downwardly open recesses 24 of a given depth which are fitted over upper portions of the guide rails 14a, 14b. When a feeder (not shown) coupled to the slide mechanism 16 is actuated, the table 22 interconnecting the guide blocks 20a, 20b is displaced in unison with the guide blocks 20a, 20b along the guide rails 14a, 14b.

A plurality of, e.g., six, levitating devices 12 arranged in two substantially parallel arrays spaced from each other by a certain distance are mounted on an upper surface of the table 22.

Figure 3:
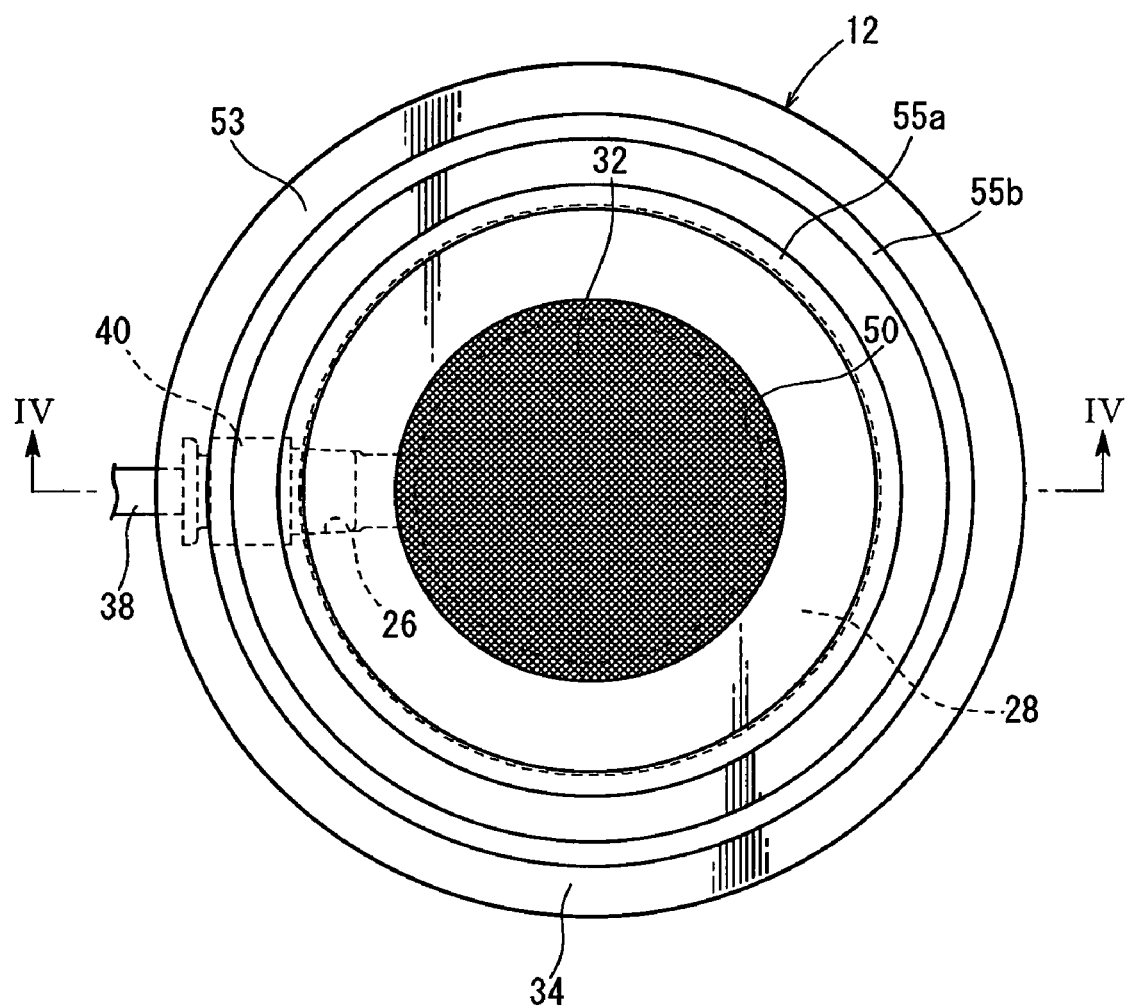
FIG. 3 is a plan view of a unit of the workpiece conveying system shown in FIG. 1.
Figure 4:
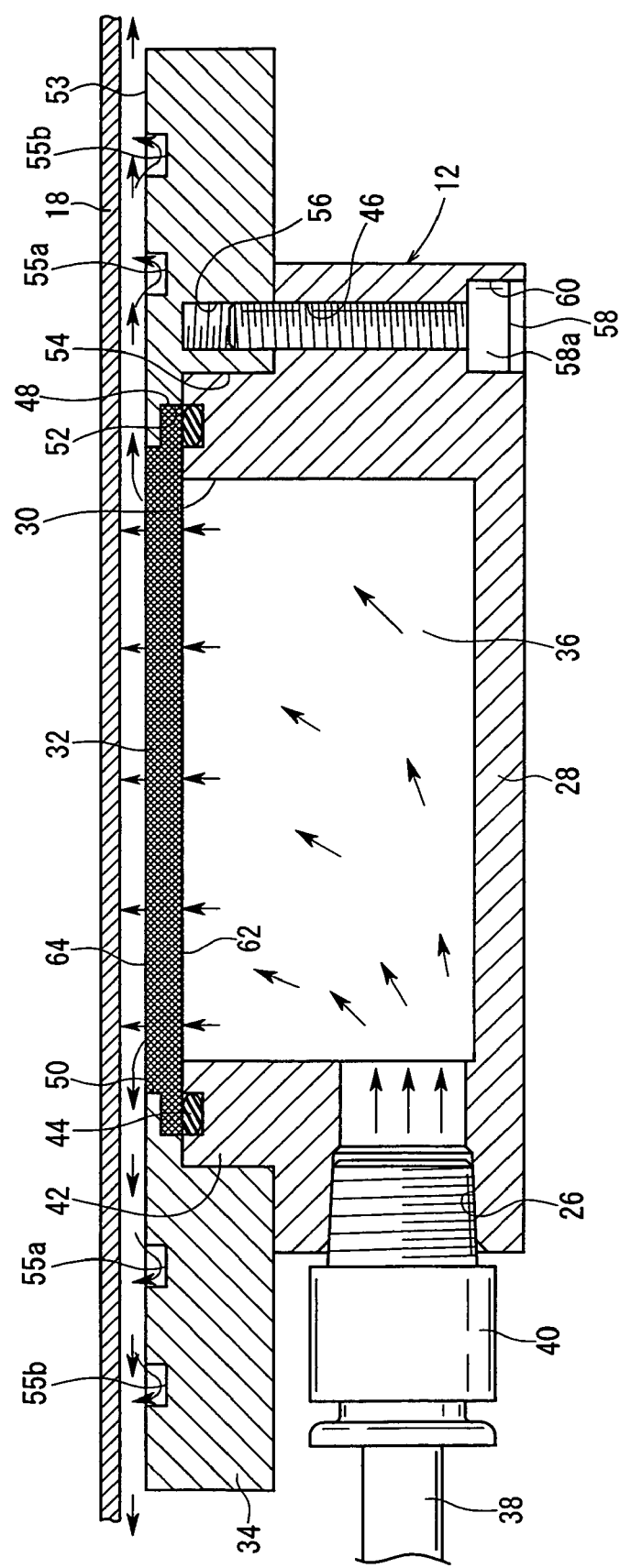
FIG. 4 is a vertical cross-sectional view taken along line IV—IV of FIG. 3.

As shown in FIGS. 3 and 4, each of the levitating devices 12 comprises a body 28 supplied with a fluid under pressure, e.g., compressed air under a positive pressure, through a supply port 26, a fluid ejection member 32 fitted into an opening 30 in the body 28, and a plate 34 gripping the fluid ejection member 32 against the body 28. The body 28 and the plate 34 are integrally joined to each other so as to function as a device body.

The body 28 is in the form of a bottomed hollow cylinder. As shown in FIG. 4, the supply port 26 is defined in a side wall of the body 28 in communication with a communication chamber 36 that is defined in the body 28. A pipe 38 connected to a pressurized fluid supply source (not shown) is connected to the supply port 26 by a joint plug 40. The fluid under pressure supplied from the pressurized fluid supply source flows through the pipe 38 and is introduced from the supply port 26 into the communication chamber 36 in the body 28.

The body 28 has an annular flange 42 projecting upwardly from an upper portion thereof on which the plate 34 is mounted, the annular flange 42 having an outer circumferential surface reduced radially inwardly from a lower outer circumferential surface of the body 28. The opening 30 is defined in the end of the annular flange 42 in communication with the communication chamber 36. An annular seal 44 is mounted in an annular groove defined in the end face of the annular flange 42 radially outwardly of the opening 30.

A bolt hole 46 is defined axially through a lower portion of the body 28 in radially outwardly spaced relation to the communication chamber 36. The body 28 has a bottom surface mounted on the table 22 (see FIG. 2).

The fluid ejection member 32 comprises a substantially circular thin plate made of a porous material such as air-permeable ceramics, sintered material, or the like, and is disposed on the end face of the annular flange 42 of the body 28. The fluid ejection member 32 has an upper portion inserted in a hole 50 (described later) defined in the plate 34. The fluid ejection member 32 also has an annular flange 48 on its lower portion projecting radially outwardly.

The fluid ejection member 32 has a plurality of pores each having an inside diameter of about 100 μm or greater. The fluid ejection member 32 may be made of any porous material insofar as it has a plurality of pores each having an inside diameter of about 100 μm or greater.

The plate 34 is of a doughnut shape having the hole 50 defined centrally therein. When the upper portion of the fluid ejection member 32 is inserted in the hole 50, the flange 48 engages an engaging step 52 of the plate 34 which has an outside diameter greater than the hole 50. At this time, a workpiece holding surface (holding surface) 53 as the upper surface of the plate 34 and an upper surface of the fluid ejection member 32 inserted in the hole 50 which faces the workpiece 18 lie substantially flush with each other.

The workpiece holding surface 53 of the plate 34 has a plurality of annular grooves 55a, 55b defined therein which are spaced radially outwardly from the hole 50 in the plate 34. The number of annular grooves 55a, 55b, which extend annularly around the hole 50, is not limited.

Figure 7:
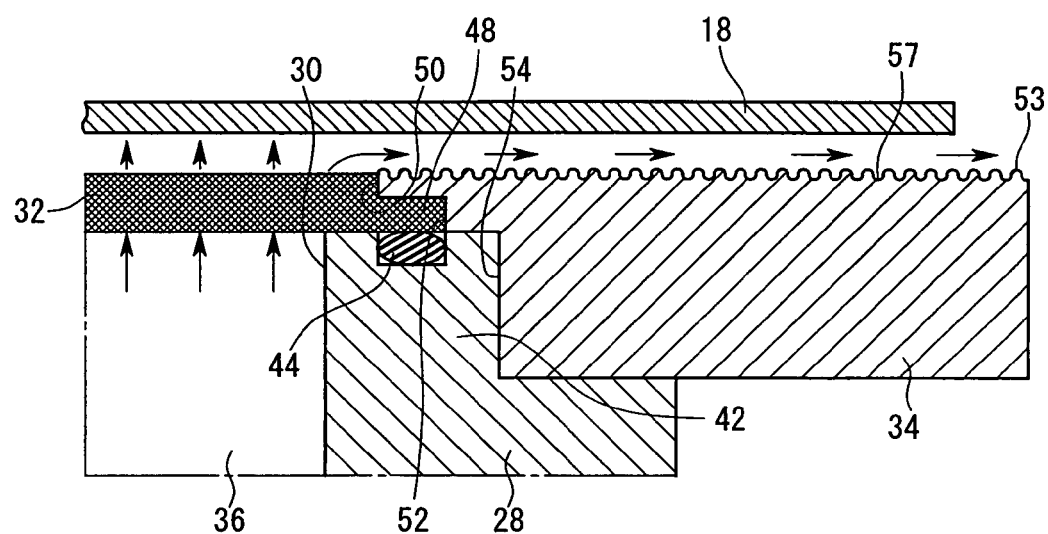
FIG. 7 is an enlarged vertical cross-sectional view of a workpiece levitating device where a workpiece holding surface is roughened, instead of forming annular grooves.

As shown in FIG. 7, the workpiece holding surface 53 of the plate 34 may have small surface unevenness 57, instead of the annular grooves 55a, 55b. The small surface unevenness 57 may be formed by blasting the workpiece holding surface 53 with steel balls in a shot blasting process, for example.

The annular grooves 55a, 55b or the surface unevenness 57 serves as a flow rate reducer on the workpiece holding surface 53. When the fluid under pressure is ejected from the fluid ejection member 32 toward the lower surface of the workpiece 18, the fluid under pressure flows between the workpiece 18 and the plate 34 radially outwardly from a central area of the plate 34. The fluid under pressure flowing radially outwardly is partly introduced into annular grooves 55a, 55b or the depressions of the small surface unevenness 57.

The annular grooves 55a, 55b or the surface unevenness 57 reduces the rate of the fluid under pressure that flows between the workpiece 18 and the workpiece holding surface 53 and is discharged into the atmosphere. Therefore, the rate of the fluid under pressure which is discharged into the atmosphere from between the workpiece 18 and the plate 34 is reduced.

The flow rate reducer disposed on the workpiece holding surface 53 for reducing the rate of the fluid under pressure is not limited to the annular grooves 55a, 55b or the surface unevenness 57. Rather, the flow rate reducer may be anything, such as protrusions projecting from the workpiece holding surface 53 toward the workpiece 18, which provides a flow resistance to the fluid under pressure flowing between the workpiece 18 and the plate 34 and has a restricting function to restrict the rate of the fluid under pressure which is discharged into the atmosphere from between the workpiece 18 and the plate 34.

The plate 34 has an annular recess 54 defined in a lower portion thereof which has a diameter greater than the engaging step 52.

The plate 34 has an internally threaded hole 56 defined therein in vertical alignment with the bolt hole 46 in the body 28. When the annular flange 42 of the body 28 is inserted into the annular recess 54 in the plate 34, a connecting bolt 58 is inserted through the bolt hole 46 into the internally threaded hole 56. The plate 34 and the body 28 are now integrally coupled to each other with the fluid ejection member 32 sandwiched therebetween. The connecting bolt 58 has a head 58a placed in a socket 60 defined in the lower surface of the body 28. Thus, the head 58a of the connecting bolt 58 does not project from the lower surface of the body 28.

When the plate 34 is mounted on the upper portion of the body 28, the seal 44 hermetically seals the gap between the upper surface of the body 28, and the fluid ejection member 32 and the plate 34. Consequently, the fluid under pressure that is introduced into the body 28 is prevented from leaking out of the body 28.

The workpiece conveying system 10 which incorporates the workpiece levitating device 12 according to the embodiment of the present invention is basically constructed as described above. Operation and advantages of the workpiece conveying system 10 will be described below. It is assumed that the workpiece conveying system 10 conveys a workpiece 18 in the form of a thin plate having a large surface area, such as a liquid crystal glass substrate or the like, for example.

First, the communication chamber 36 in the body 28 of each of the levitating devices 12 is supplied with the fluid under pressure through the pipe 38 that is connected to the non-illustrated pressurized fluid supply source. The rates of the fluid under pressure supplied respectively to the levitating devices 12 are controlled so as to be equalized by a controller or the like (not shown).

The fluid under pressure supplied to each of the levitating devices 12 passes into the fluid ejection member 32 from a first passing surface 62 thereof facing the communication chamber 36, and flows from a second passing surface 64 of the fluid ejection member 32 which is opposite to the first passing surface 62 toward the workpiece holding surface 53 of the plate 34. At this time, the rates of the fluid under pressure flowing from the second passing surfaces 64 of the respective fluid ejection members 32 are controlled so as to be substantially equal to each other.

Then, the workpiece 18 is placed substantially horizontally over the workpiece conveying system 10 by a robot mechanism or the like (not shown) (see FIG. 1).

The fluid under pressure ejected upwardly from the fluid ejection members 32 of the levitating devices 12 is applied to the workpiece 18. After the fluid under pressure is applied to the workpiece 18, it flows radially outwardly between the workpiece 18 and the workpiece holding surface 53 of the plate 34, and is then discharged into the atmosphere.

At this time, part of the fluid under pressure flows into the annular grooves 55a, 55b, which provide a flow resistance to the fluid under pressure. The annular grooves 55a, 55b thus reduce the rate of the fluid under pressure that flows between the workpiece 18 and the workpiece holding surface 53, so that the rate of the fluid under pressure which is discharged into the atmosphere from between the workpiece 18 and the workpiece holding surface 53 is reduced.

The space between the workpiece 18 and the plate 34 is continuously supplied with the fluid under pressure from the fluid ejection member 32 at a rate greater than the fluid under pressure which flows between the workpiece 18 and the plate 34. Therefore, the fluid under pressure is continuously forced into the space between the workpiece 18 and the plate 34, increasing the pressure P1 of the fluid between the workpiece 18 and the plate 34.

Figure 6:
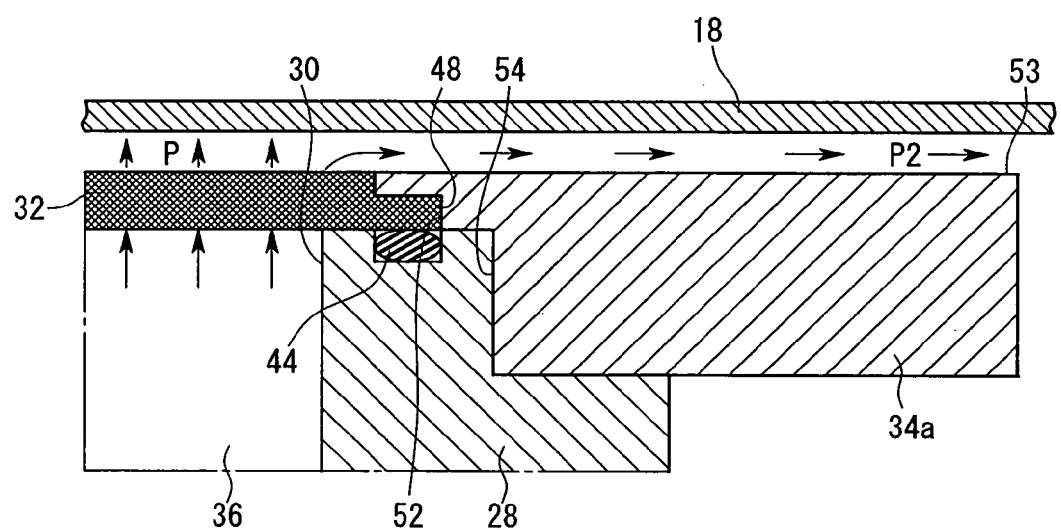
FIG. 6 is an enlarged vertical cross-sectional view of a workpiece levitating device according to a comparative example in which no annular grooves are provided in a workpiece holding surface.

Specifically, FIG. 6 shows in enlarged vertical cross section a workpiece levitating device according to a comparative example in which no annular grooves are provided the workpiece holding surface 53 of a plate 34a. In the workpiece levitating device shown in FIG. 6, the fluid under pressure flowing from the fluid ejection member 32 into the space between the workpiece 18 and the workpiece holding surface 53 flows at an unreduced rate and is discharged into the atmosphere from between the workpiece 18 and the workpiece holding surface 53.

As the fluid under pressure ejected from the fluid ejection member 32 flows radially outwardly of the plate 34 and the workpiece 18, however, the pressure of the fluid is gradually lowered from the pressure P at the time the fluid is ejected from the fluid ejection member 32, to a pressure P2 (P>P2). Accordingly, the rate of the fluid under pressure needs to be increased in order to levitate and hold the workpiece 18 at a desired height over the levitating device 12.

Figure 5:
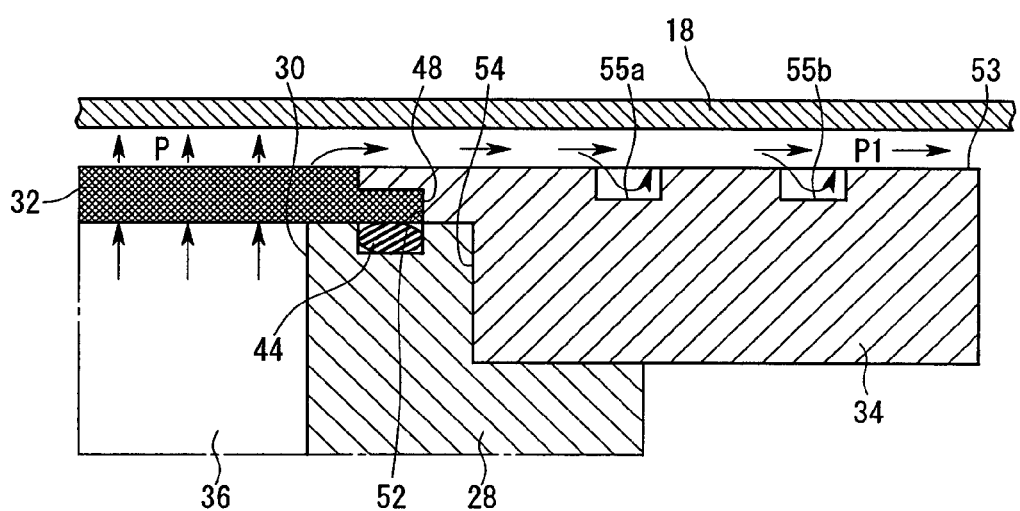
FIG. 5 is an enlarged vertical cross-sectional view showing portions of annular grooves in a workpiece holding surface and a workpiece shown in FIG. 4.

According to the present embodiment, as shown in FIG. 5, part of the fluid under pressure flows into the annular grooves 55a, 55b defined in the workpiece holding surface 53 or the depressions of the surface unevenness 57 (see FIG. 7), which reduce the rate of the fluid under pressure that flows between the workpiece 18 and the workpiece holding surface 53 and is then discharged into the atmosphere. Accordingly, the pressure P1 of the fluid between the workpiece 18 and the plate 34 is increased to a level which is substantially the same as the pressure P at the time the fluid is ejected from the fluid ejection member 32 (P1≈P). Consequently, even when the rate of the fluid under pressure that is ejected from the fluid ejection member 32 is reduced, the workpiece 18 can be levitated to a desired height over the levitating device 12 and held substantially parallel to the end face of the plate 34.

At this time, the workpiece 18 is kept airborne at a position where the surface area and weight of the workpiece 18 which bears the pressure of the fluid ejected from the second passing surface 64 and the pressing force applied by the fluid under pressure tending to push the workpiece 18 upwardly are kept in equilibrium. As a result, the workpiece 18 is upwardly spaced a certain distance from the workpiece holding surface 53 of the plate 34 under the pressure of the fluid that is ejected from the fluid ejection member 32 of the levitating device 12, and is maintained substantially parallel to the workpiece holding surface 53 of the plate 34 (see FIG. 2).

The distance by which the workpiece 18 kept airborne by the fluid under pressure is spaced from the plate 34 is set by the pressure of the fluid ejected from the fluid ejection member 32, the shape and weight of the workpiece 18, the inside diameter of the pores of the fluid ejection member 32, and the position and shape of the annular grooves 55a, 55b.

Figure 2:
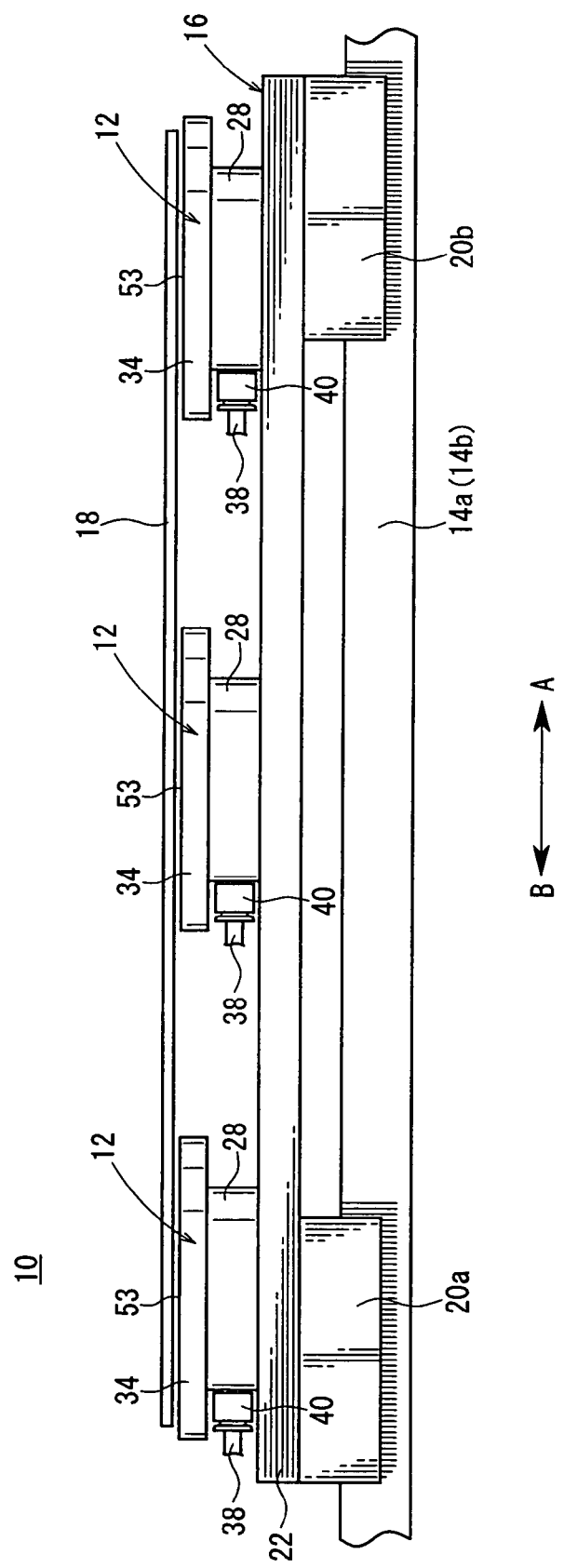
FIG. 2 is a side elevational view of the workpiece conveying system shown in FIG. 1.

Finally, as shown in FIG. 2, while the workpiece 18 is being held over the levitating devices 12 under the pressure of the fluid, the slide mechanism 16 which supports the levitating devices 12 is displaced in the direction indicated by the arrow A by the feeder, e.g., an actuator. The table 22 of the slide mechanism 16 is now displaced in the direction indicated by the arrow A with the guide blocks 20a, 20b moving along the guide rails 14a, 14b. The workpiece 18 is thus conveyed while being levitated in the air by the slide mechanism 16. The workpiece 18 is prevented from being displaced substantially horizontally by a stop mechanism (not shown) disposed on each of the levitating devices 12. Therefore, when the levitating devices 12 are displaced axially by the slide mechanism 16, the workpiece 18 is prevented from being dislodged from above the levitating devices 12.

Therefore, the workpiece 18 can be conveyed while being kept out of contact with the workpiece conveying system 10 including the levitating devices 12, and hence dust particles, etc. are prevented from being attached to the workpiece 18.

After the workpiece 18 is fed in the direction indicated by the arrow A by the slide mechanism 16 and the conveyance of the workpiece 18 is completed, the workpiece 18 is unloaded from the workpiece conveying system 10, and then the slide mechanism 16 is displaced by in the direction indicated by the arrow B by the feeder (not shown). The levitating devices 12 on the slide mechanism 16 are now returned to their original position.

Figure 8:
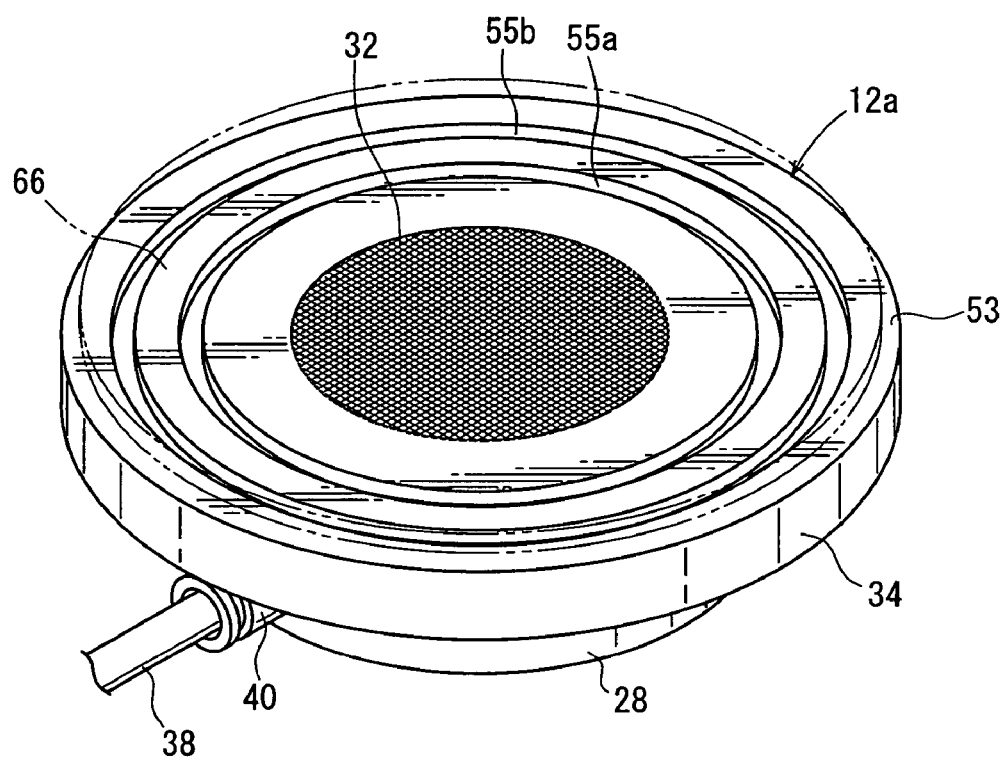
FIG. 8 is a perspective view of a unit of the workpiece levitating device by which a semiconductor wafer as a workpiece is levitated and held.

In the above embodiment, the levitating devices 12 are disposed at spaced intervals on the slide mechanism 16 and convey the workpiece 18 such as a liquid crystal glass substrate or the like having a large surface area while holding the workpiece 18 airborne. However, as shown in FIG. 8, the workpiece 66 such as a disk-shaped semiconductor wafer or the like may be levitated by a single levitating device 12a, and conveyed by a conveying system (not shown).

In the present embodiment, as described above, the fluid ejection member 32 made of a porous material is inserted in the hole 50 in the plate 34, and the workpiece holding surface 53 of the plate 34 which faces the workpiece 18, 66 has the annular grooves 55a, 55b or the small surface unevenness 57.

When the fluid under pressure supplied from the body 28 and ejected from the fluid ejection member 32 flows between the workpiece 18, 66 and the workpiece holder surface 53 and is then discharged into the atmosphere, part of the fluid under pressure flows into the annular grooves 55a, 55b or the depressions of the small surface unevenness 57. The annular grooves 55a, 55b or the depressions of the small surface unevenness 57 provides a flow resistance to the fluid under pressure flowing between the workpiece 18, 66 and the workpiece holding surface 53, restricting the rate of the fluid under pressure which is discharged into the atmosphere.

Therefore, the pressure P1 of the fluid between the workpiece 18, 66 and the plate 34 is increased and remains workpiece 18, 66 and the plate 34 is increased and remains substantially equal to the pressure P at the time the fluid is ejected from the fluid ejection member 32 (P1≈P).

As a consequence, the annular grooves 55a, 55b or the small surface unevenness 57 on the workpiece holding surface 53 is effective to levitate the workpiece 18, 66 in the air at a reduced rate of the fluid under pressure, thus reducing the amount of consumed fluid under pressure.

The workpiece 18, 66 is pushed by the fluid under pressure above not only the fluid ejection member 32, but also the workpiece holding surface 53 which lies substantially flush with the second passing surface 64 of the fluid ejection member 32. Therefore, the workpiece 18, 66 is subject to a pressing force applied to a wide area thereof, and is hence prevented from being strained or flexed by gravity. The workpiece 18, 66 can thus be held stably substantially parallel to the workpiece holding surface 53.

Dust particles contained in the fluid under pressure that flows through the fluid ejection member 32 may possibly be deposited in the pores of the fluid ejection member 32 during usage over an extended period of time. When the fluid ejection member 32 is clogged by such dust particles, the fluid ejection member 32 is detached from the levitating device 12 and cleaned to remove the deposited dust particles from the pores. Since the pores have an inside diameter of about 100 μm or greater, the deposited dust particles can easily be removed from the fluid ejection member 32.

Workpiece levitating devices 100, 110, 130, 140, 150 according to first through fifth modifications, each having a plurality of fluid ejection members mounted on a single plate, will be described below. Those parts of the workpiece levitating devices 100, 110, 130, 140, 150 which are identical to those of the workpiece levitating device 12 according to the above embodiment are denoted by identical reference characters, and will not be described in detail below.

Figure 9:
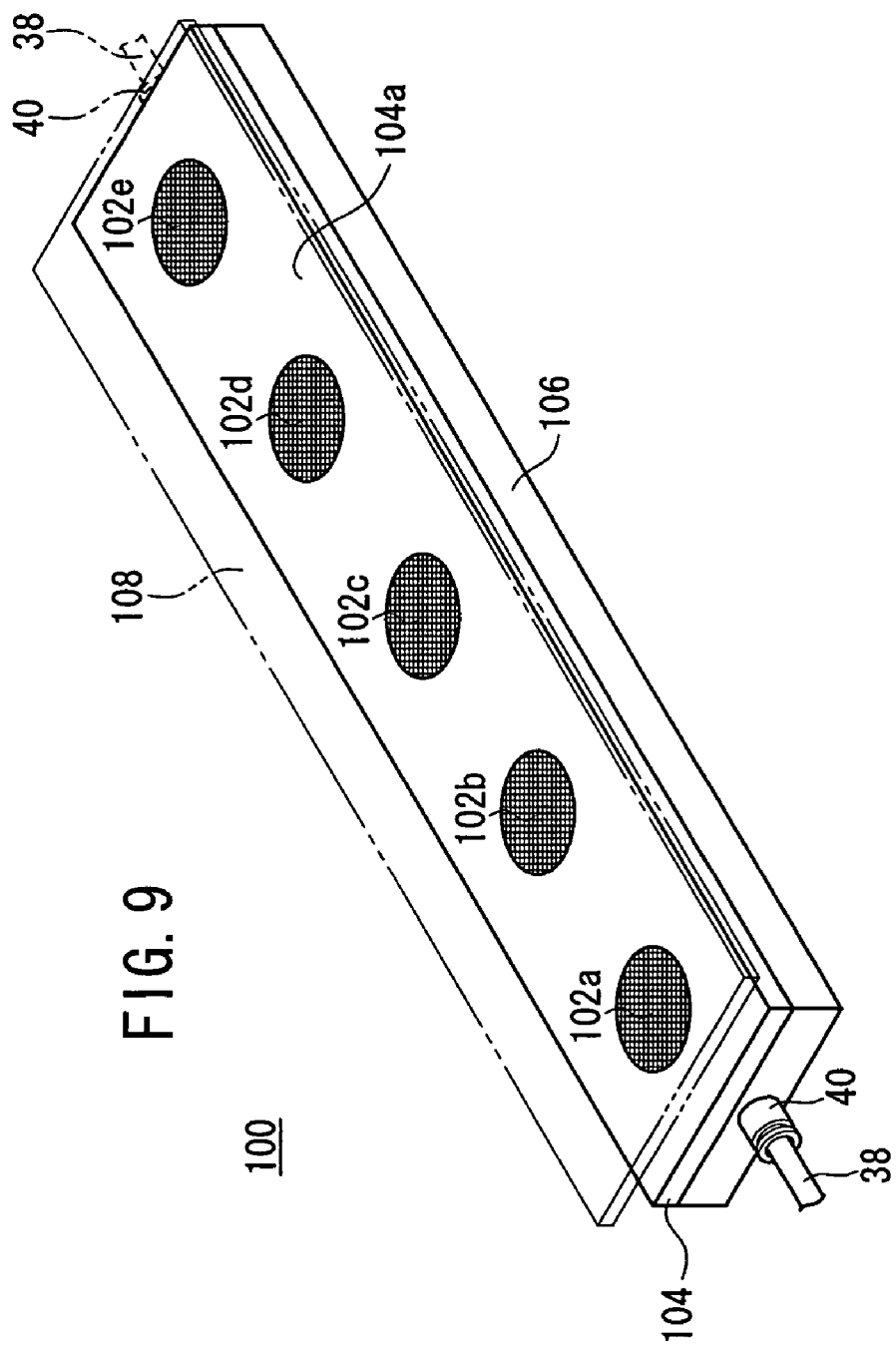
FIG. 9 is a perspective view of a workpiece levitating device according to a first modification which has a plurality of fluid ejecting members mounted as a straight array on an elongate plate.

As shown in FIG. 9, the workpiece levitating device 100 according to the first modification has a plurality of, e.g., five, fluid ejection members 102a through 102e mounted as a straight array on an elongate plate 104 that is mounted on an upper portion of a body 106. The fluid ejection members 102a through 102e are spaced a predetermined distance along the longitudinal direction of the plate 104.

The body 106 has a support port (not shown) defined in a side wall thereof and communicating with a communication chamber in the body 106 for supplying a fluid under pressure to the fluid ejection members 102a through 102e. The pipe 38 connected to the pressurized fluid supply source (not shown) is connected to the supply port by the joint plug 40.

The plate 104 has a workpiece holding surface 104a having annular grooves or small surface unevenness (not shown) as with the workpiece levitating device 12 according to the above embodiment. The annular grooves or small surface unevenness provides a flow resistance to the fluid under pressure flowing along the workpiece holding surface 104a.

The support port, the pipe 38, and the joint plug 40 for supplying the fluid under pressure may not be disposed on one end face of the body 106, but may be disposed on one and other end faces of the body 106, as indicated by the two-dot-and-dash lines in FIG. 9.

With the workpiece levitating device 100 according to the first modification, the fluid under pressure is supplied from the non-illustrated pressurized fluid supply source through the pipe 38 and the supply port (not shown) into the body 106. The fluid under pressure is then ejected from the fluid ejection members 102a through 102e on the plate 104 toward the workpiece holding surface 104a of the plate 104. At this time, the rates of the fluid under pressure ejected respectively from the fluid ejection members 102a through 102e controlled in the body 106 so as to be substantially equalized to each other.

The workpiece 108 is held above the workpiece holding surface 104a of the plate 104 by the fluid ejection members 102a through 102e.

Since the fluid ejection members 102a through 102e are mounted on the single plate 104 and the workpiece 108 is levitated and held by the fluid under pressure supplied from the single pipe 38 and the support port, the workpiece 108 which has a greater surface area can be levitated and held efficiently.

Figure 10:
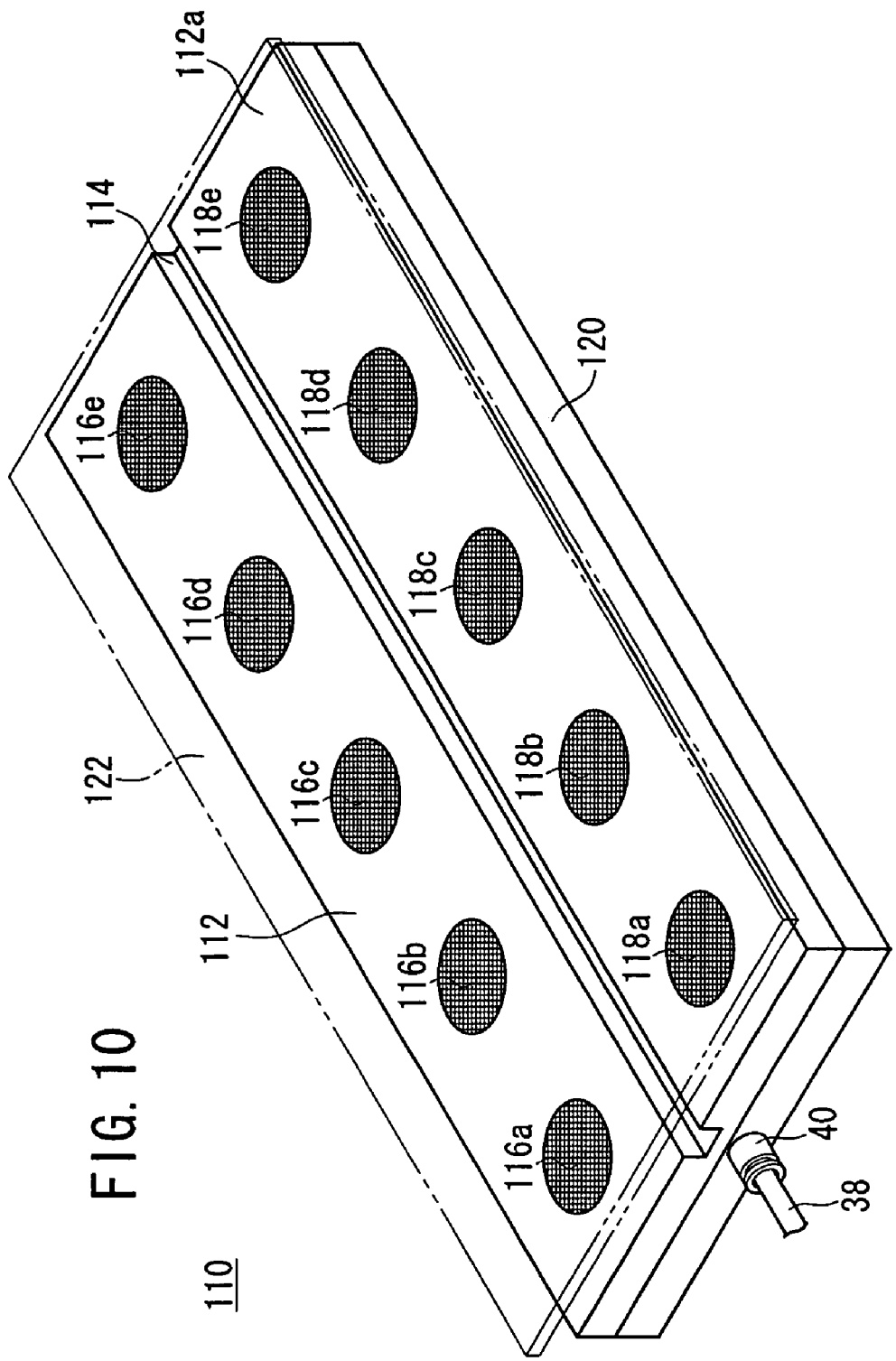
FIG. 10 is a perspective view of a workpiece levitating device according to a second modification which has two substantial parallel straight arrays of fluid ejecting members mounted at a spaced interval on a plate.

As shown in FIG. 10, the workpiece levitating device 110 according to the second modification has a straight groove 114 defined substantially centrally in a plate 112 and extending in the longitudinal direction of the plate 112, and a plurality of first fluid ejection members 116a through 116e and second fluid ejection members 118a through 118e which are positioned substantially symmetrically with respect to the straight groove 114. The first fluid ejection members 116a through 116e and the second fluid ejection members 118a through 118e are substantially parallel to each other.

The plate 112 is mounted on an upper portion of a body 120, and the pipe 38 connected to the non-illustrated pressurized fluid supply and the joint plug 40 are coupled to the body 120. The plate 112 has a workpiece holding surface 112a having annular grooves or small surface unevenness (not shown) as with the workpiece levitating device 12 according to the above embodiment. The annular grooves or small surface unevenness provides a flow resistance to the fluid under pressure flowing along the workpiece holding surface 112a.

As described above, the first fluid ejection members 116a through 116e and the second fluid ejection members 118a through 118e are mounted on the single plate 112, and disposed substantially parallel to each other. Therefore, since a range for levitating a workpiece 122 with the workpiece levitating device 110 is expanded transversely, the workpiece levitating device 110 can efficiently levitate and hold the workpiece 122 which has a much greater surface area.

Figure 11:
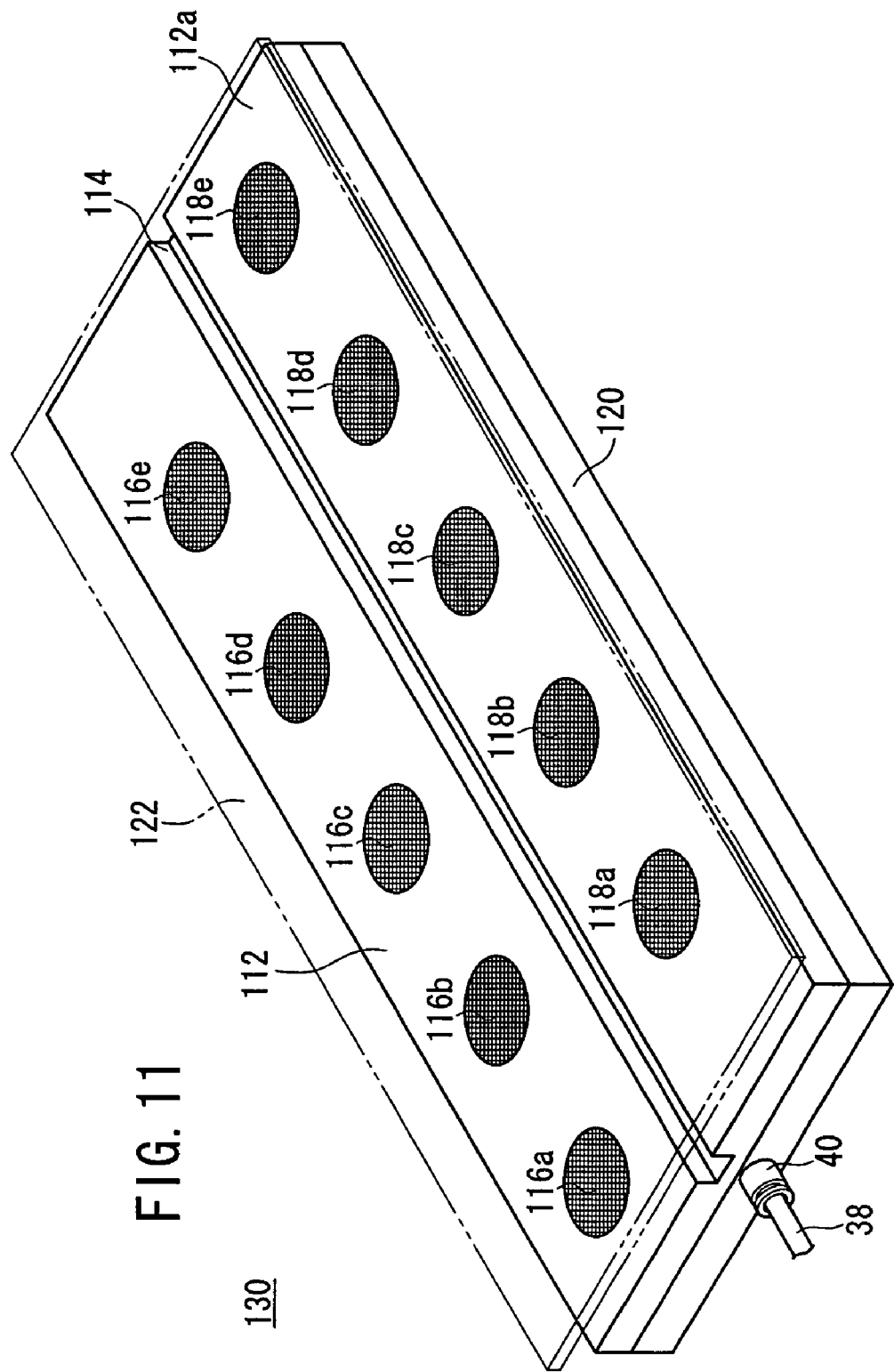
FIG. 11 is a perspective view of a workpiece levitating device according to a third modification similar to the workpiece levitating device shown in FIG. 10, but which has two substantial parallel straight arrays of fluid ejecting members that are staggered in the longitudinal direction of a plate.

As shown in FIG. 11, the workpiece levitating device 130 according to the third modification differs from the workpiece levitating device 110 according to the second modification shown in FIG. 10 in that the first fluid ejection members 116a through 116e and the second fluid ejection members 118a through 118e are staggered a predetermined distance in the longitudinal direction of the plate 112.

Figure 12:
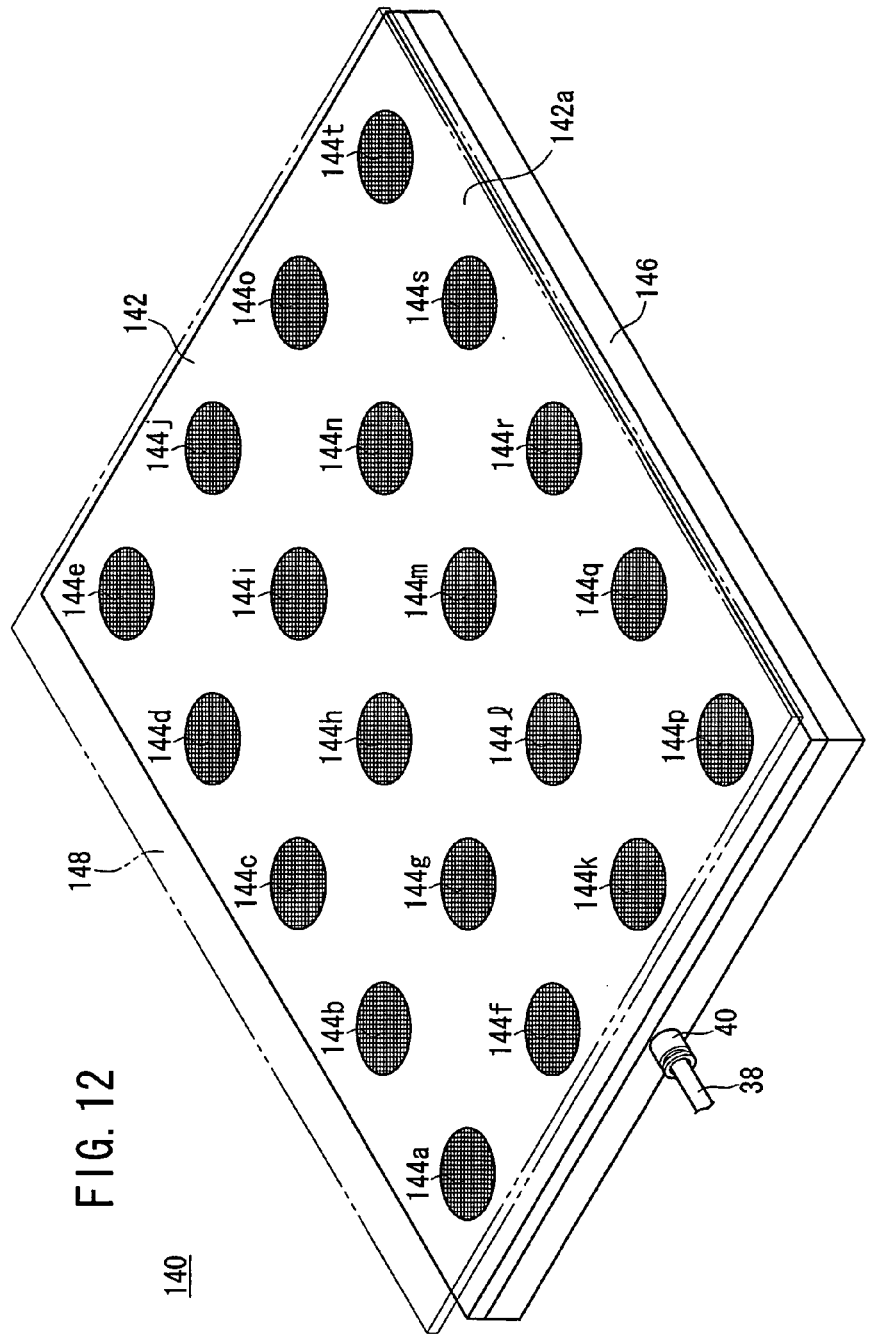
FIG. 12 is a perspective view of a workpiece levitating device according to a fourth modification which has a plurality of fluid ejecting members disposed at spaced intervals on a substantially rectangular plate.

As shown in FIG. 12, the workpiece levitating device 140 according to the fourth modification has a plurality, e.g., twenty, fluid ejection members 144a through 144t disposed predetermined spaced intervals and mounted on a substantially rectangular plate 142.

The plate 142 is mounted on an upper portion of a body 146. The body 146 has a support port (not shown) defined substantially centrally in a side wall thereof and communicating with the interior of the body 146 for supplying the fluid under pressure to the fluid ejection members 144a through 144t. The plate 142 has a workpiece holding surface 142a having annular grooves or small surface unevenness (not shown) as with the workpiece levitating device 12 according to the above embodiment. The annular grooves or small surface unevenness provides a flow resistance to the fluid under pressure flowing along the workpiece holding surface 142a.

The pipe 38 connected to the non-illustrated pressurized fluid supply source is connected through the joint plug 40 to the supply port. The fluid under pressure is supplied from the non-illustrated pressurized fluid supply source through the pipe 38 and the support port (not shown) into the body 146.

The fluid under pressure is ejected from the fluid ejection members 144a through 144t toward the workpiece holding surface 142a of the plate 142. At this time, the rates of the fluid under pressure ejected respectively from the fluid ejection members 144a through 144t are controlled so as to be equalized by a controller or the like (not shown).

As a result, the workpiece 148 is held above the workpiece holding surface 142a of the plate 142 by the fluid ejection members 144a through 144t.

The plate 142 has a width greater than the plates 104, 112 of the workpiece levitating devices 100, 110 according to the first and second modifications. When the fluid under pressure is ejected from the fluid ejection members 144a through 144t mounted on the plate 142, the workpiece levitating device 140 can levitate and hold a workpiece 148 having a far greater surface area.

Figure 13:
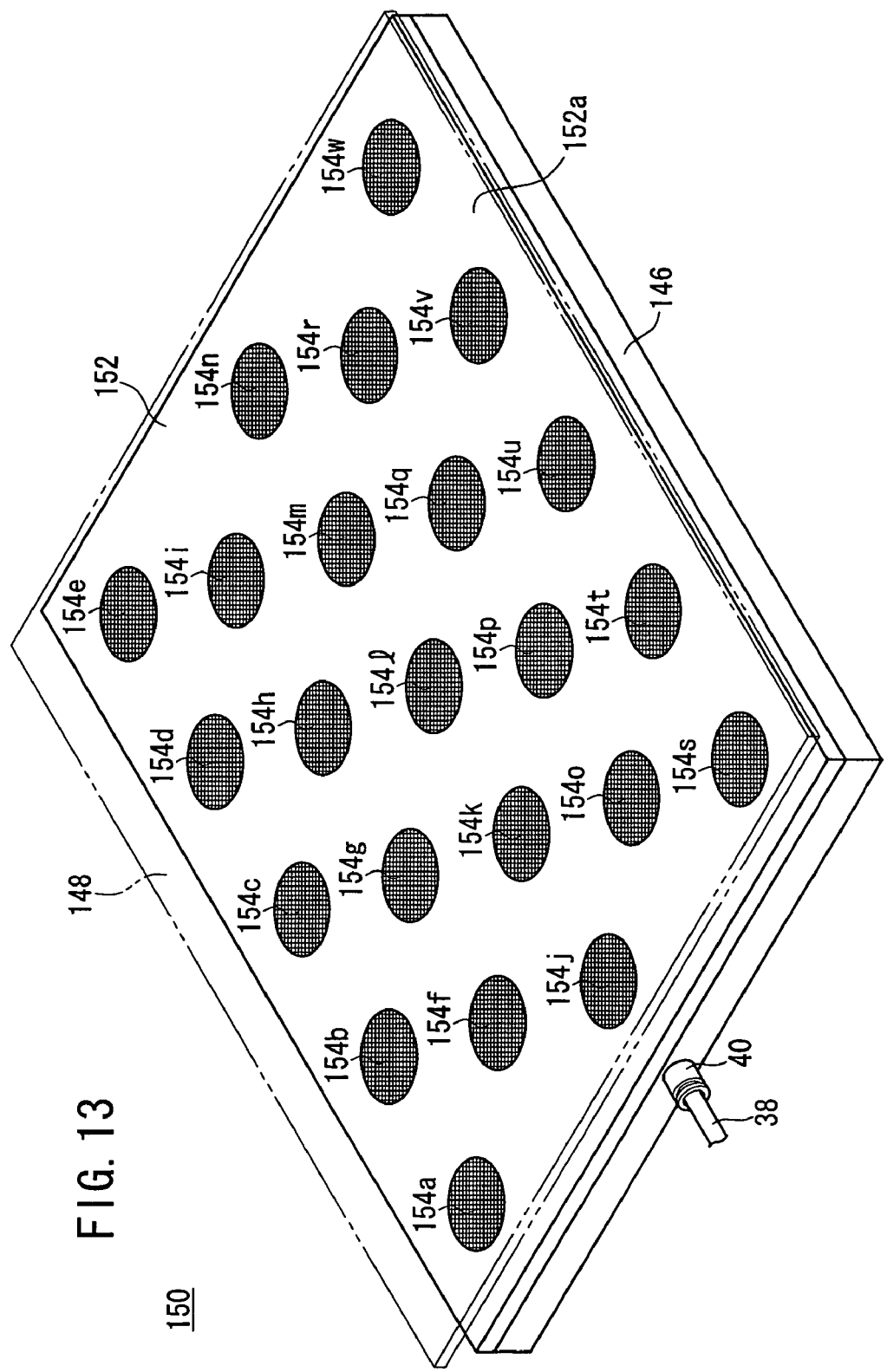
FIG. 13 is a perspective view of a workpiece levitating device according to a fifth modification which similar to the workpiece levitating device shown in FIG. 12, but which has a plurality of fluid ejecting members that are staggered in the longitudinal direction of a plate.

As shown in FIG. 13, the workpiece levitating device 150 according to the fifth modification differs from the workpiece levitating device 140 according to the fourth modification shown in FIG. 12 in that adjacent ones of a plurality of fluid ejection members 154a through 154w mounted on a plate 152 are staggered from each other. The plate 152 has a workpiece holding surface 152a having annular grooves or small surface unevenness (not shown) as with the workpiece levitating device 12 according to the above embodiment. The annular grooves or small surface unevenness provides a flow resistance to the fluid under pressure flowing along the workpiece holding surface 152a.

Although certain preferred embodiments of the present invention have been shown and described in detail, it should be understood that various changes and modifications may be made therein without departing from the scope of the appended claims.

What is claimed is:

1. A workpiece levitating device for conveying a workpiece while independently applying a pressure to the workpiece with a fluid under pressure to keep the workpiece airborne, comprising:
    a device body for being supplied with the fluid under pressure therein, said device body including an opening defined therein which opens toward said workpiece;
    a fluid ejection member made of a porous material and fitted into the opening in said device body, for passing therethrough the fluid under pressure supplied from said device body and ejecting the fluid under pressure toward said workpiece; and
    a flow rate reducer disposed on a holding surface of said device body which faces said workpiece, and below said workpiece, for reducing a rate of the fluid under pressure flowing between said holding surface and said workpiece thereby to increase a pressure of said fluid under pressure which is present between said holding surface and said workpiece, levitating said workpiece.

2. A workpiece levitating device according to claim 1, wherein said flow rate reducer provides a flow resistance to the fluid under pressure flowing between said holding surface and said workpiece.

3. A workpiece levitating device according to claim 1, wherein said flow rate reducer comprises a groove portion defined in said holding surface and depressed in a direction away from said workpiece.

4. A workpiece levitating device according to claim 3, wherein said groove portion comprises a plurality of annular grooves successively arranged in a direction away from said fluid ejection member.

5. A workpiece levitating device according to claim 4, wherein said annular grooves are radially spaced at predetermined intervals.

6. A workpiece levitating device according to claim 1, wherein said flow rate reducer comprises surface unevenness of said holding surface facing said workpiece.

7. A workpiece levitating device according to claim 1, wherein said fluid ejection member has a surface facing said workpiece and lying substantially flush with said holding surface.

8. A workpiece levitating device according to claim 1, wherein a plurality of said fluid ejection members are mounted at predetermined spaced intervals on said device body, and have surfaces facing said workpiece and lying substantially flush with said holding surface.

9. A workpiece levitating device according to claim 8, wherein said fluid ejection members are arranged in a straight array in a longitudinal direction of said device body.

10. A workpiece levitating device according to claim 8, wherein said fluid ejection members include a group of fluid ejection members and another group of fluid ejection members which are arranged in respective straight arrays in a longitudinal direction of said device body and disposed substantially parallel to each other.

* * * * *